United States Patent
Hamilton et al.

(10) Patent No.: US 7,424,377 B2
(45) Date of Patent: Sep. 9, 2008

(54) POWER REDUCTION METHOD IN AN ELECTRONIC COUNTER

(75) Inventors: David Hamilton, Tallassee, AL (US); Tim Bianchi, Tallassee, AL (US)

(73) Assignee: Neptune Technology Group, Inc., Tallassee, AL (US)

( * ) Notice: Subject to any disclaimer, the term of this patent is extended or adjusted under 35 U.S.C. 154(b) by 290 days.

(21) Appl. No.: 10/701,318

(22) Filed: Nov. 4, 2003

(65) Prior Publication Data

US 2004/0109527 A1  Jun. 10, 2004

Related U.S. Application Data

(60) Provisional application No. 60/423,598, filed on Nov. 4, 2002.

(51) Int. Cl.
G01R 21/00 (2006.01)
G01F 1/00 (2006.01)
G01F 7/00 (2006.01)

(52) U.S. Cl. .......................... 702/60; 702/45

(58) Field of Classification Search ............. 702/45–47, 702/57, 60, 61, 63, 65, 78, 80; 365/226–229; 324/74; 377/13, 16, 21, 26; 73/196, 197
See application file for complete search history.

(56) References Cited

U.S. PATENT DOCUMENTS

| | | | | |
|---|---|---|---|---|
| 3,824,378 A | * | 7/1974 | Johnson et al. | 377/39 |
| 4,564,922 A | * | 1/1986 | Muller | 711/161 |
| 4,611,282 A | * | 9/1986 | McFiggans | 705/30 |
| 4,804,957 A | * | 2/1989 | Selph et al. | 340/870.03 |
| 4,903,437 A | * | 2/1990 | Kubotera et al. | 451/5 |
| 5,181,231 A | * | 1/1993 | Parikh et al. | 377/26 |
| 6,710,721 B1 | | 3/2004 | Holowick | |
| 6,778,099 B1 | | 8/2004 | Meyer et al. | |
| 6,798,352 B2 | | 9/2004 | Holowick | |
| 7,224,339 B2 | * | 5/2007 | Koyama et al. | 345/98 |
| 2002/0083778 A1 | * | 7/2002 | Hamilton | 73/861.78 |
| 2003/0009301 A1 | * | 1/2003 | Anand et al. | 702/62 |
| 2004/0113812 A1 | * | 6/2004 | Bianchi et al. | 340/870.02 |
| 2004/0123656 A1 | * | 7/2004 | Castleberry et al. | 73/197 |

FOREIGN PATENT DOCUMENTS

WO  2005/048002  *  5/2005

* cited by examiner

Primary Examiner—Michael P Nghiem
(74) Attorney, Agent, or Firm—David E. Mixon; Bradley Arant Rose & White LLP

(57) ABSTRACT

A method for operating an electronic counter with reduced power consumption has been developed. The electronic counter is divided into multiple segments that are ordered according to their numerical value. As the counter is updated, it becomes necessary to propagate data between the segments. If the supply energy of the counter meets or exceeds a set limit, the data is propagated to the next highest segment. However, if the supply energy of the counter falls below the set limit, the data to be propagated is stored in a propagation carry counter.

10 Claims, 12 Drawing Sheets

| Parameter | Symbol | Min | Typ | Max | Unit |
|---|---|---|---|---|---|
| External Capacitor Load on Vdd1 | Cl | 3.685 | 3.9 | 4.11 | nF |
| Total Charge (3 FeRAM accesses) | Qt | | | 3.27 | nC |
| Vdd1 maximum operating | VopH | 4.6 | 4.8 | 5.0 | V |
| Vdd1 minimum operating (at end of operation) | VopL | | | 3.5 | V |
| Tracking between VopH and Vth1 | | -0.05 | 0 | +0.05 | V |
| Tracking between VopH and Vth2 | | -0.05 | 0 | +0.05 | V |

FIG. 9a

| PARAMETER | Min | Typ | Max | Unit |
|---|---|---|---|---|
| Vth1 | 3.796 | 3.996 | 4.196 | V |
| Total Charge (3 FeRAM accesses) | 3.944 | 4.144 | 4.344 | V |

FIG. 9b

| Tracking | Min | Typ | Max | Unit |
|---|---|---|---|---|
| VopH - Vth1 | 0.754 | 0.804 | 0.854 | V |
| VopH - Vth2 | .0606 | .656 | .0706 | V |

FIG. 9c

POWER REDUCTION METHOD IN AN ELECTRONIC COUNTER

CROSS-REFERENCE TO RELATED APPLICATIONS

This application claims priority from U.S. Provisional Application No. 60/423,598 for "Electronic Coding Self Powered Water Meter" that was filed on Nov. 4, 2002.

BACKGROUND OF INVENTION

1. Field of the Invention

The invention relates generally to electronic counters. More specifically, the invention relates to a power reduction method for an electronic counter.

2. Background Art

Electronic counters have a wide variety of uses. One example is use in measuring meters that kept track of volumetric flow. These meters are commonly used by utilities to keep track of the consumption of an end user. For example, utility companies that supply water to their customers typically charge for their product based on usage. Usage of water is typically measured by a meter that is installed for each individual customer on their respective water supply line. A utility company employee periodically (usually once a month) manually collects the reading from the meter. These readings are usually cumulative, so the amount of usage for the present period is calculated by subtracting the reading from the previous period. Once the usage is calculated, the customer is billed for that amount of water used during that period.

Manually reading water usage meters is labor intensive, time consuming expensive, and subject to human error especially for residential customers because each meter monitors relatively little water usage as compared with larger, commercial customers. As a result, electronic meters have been used to allow for quicker, more efficient, and more accurate collection of water usage data. The electronic meters measure water usage by monitoring the water flow through a conventional, mechanical fluid meter. The usage readings are stored in an electronic counter and then transmitted via radio signals to a local transmitter/receiver operated by the utility.

However, electronic meters require a power source. Typically, such a meter relies on a battery for power. The battery must be replaced manually, which is another time consuming and expensive process. Additionally, if the battery fails, the utility may be unable to determine the correct water usage at the meter and consequently under bill the customer. Also, the data processing components of such meter typically use non-volatile memory that can preserve the data from the meter if the power fails. All of the power consumption characteristics of such meters make power efficiency very desirable.

SUMMARY OF INVENTION

In some aspects, the invention relates to a method for operating an electronic counter, comprising: updating the electronic counter where the electronic counter is divided into a plurality of segments that are configured according to numerical value; propagating data between the segments if the supply energy of the electronic counter meets or exceeds a pre-determined value; and storing the propagated data in a propagation carry counter if the supply energy of the electronic counter does not meet the pre-determined value.

In other aspects, the invention relates to a method for operating an electronic counter, comprising: step for counting usage data from the water meter in a plurality of hierarchal memory segments; step for propagating usage data between the memory segments in sufficient power exists in the electronic counter; and step for temporarily storing propagated usage data if insufficient power exists in the electronic counter.

Other aspects and advantages of the invention will be apparent from the following description and the appended claims.

BRIEF DESCRIPTION OF DRAWINGS

It should be noted that identical features in different drawings are shown with the same reference numeral.

FIGS. 9a-9c shows charts for the values and ranges of system parameters in accordance with one embodiment of the present invention.

DETAILED DESCRIPTION

A power reduction method is an electronic counter has been developed. While the use of an electronic counter will be described here for use with measuring meter as an example, it is important to note that the invention can be used with an electronic counter in any application. This is especially true in situations where the counter is used in devices that put a premium on power efficiency such as notebook computers or other battery powered electronic devices.

The measuring meter used as an example in this description, measures and records volumetric usage of a material as it passes through the meter. The meter could be used in utility applications to measure water, gas or electricity usage. Additionally, such meters are commonly used in industrial applications to measure the flowrates of various components. In this section, a self-powered water meter in a utility application will be used to describe various embodiments of the present invention. However, it should be understood that the invention as described, can be applied to many different types of measuring meters in a wide variety of applications.

Figure 1:
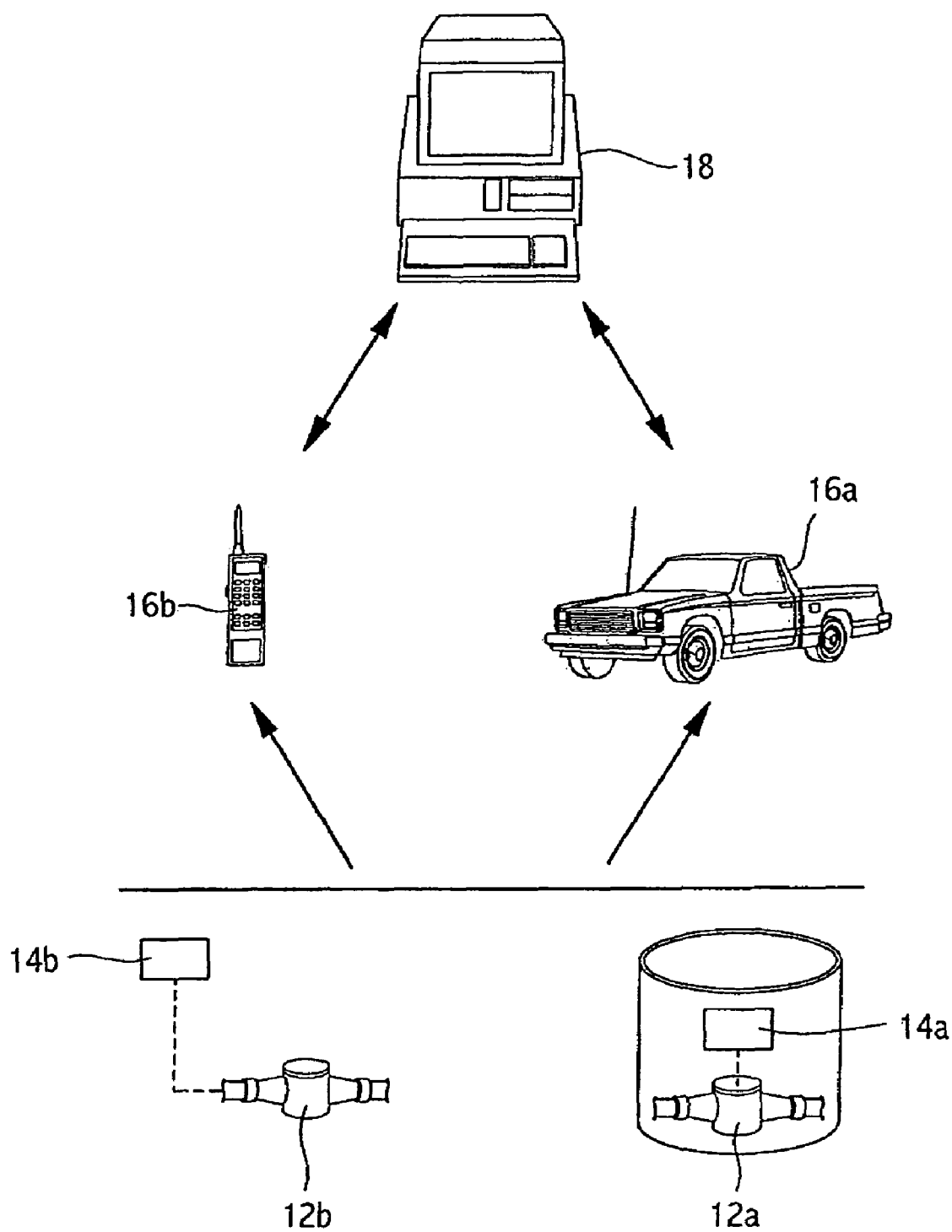
FIG. 1 shows a diagram of an electronic water meter monitoring system in accordance with one embodiment of the present invention.

FIG. 1 shows a diagram of an electronic water meter monitoring system 10 in accordance with one embodiment of the present invention. The system 10 includes an electronic water meter 12a or 12b for an individual customer. The meter is typically located at a point on the customer's individual supply line between the customer and utility's main supply line. A meter interface unit (MIU) 14a or 14b is connected to the respective meter 12a or 12b. The MIU 14a or 14b is an electronic device that collects meter usage data from an electronic register on its respective meter and transmits the data to a local transmitter/receiver 16a or 16b via radio signals. In alternative embodiments, other external devices could be used such as a laptop computer, a data logger, or other suitable device known in the art. Two alternative embodiments of the electronic water meters are shown. The first embodiment includes a meter 12a and MIU 14a that are located underground or a "pit" unit. The other embodiment includes a meter 12b and MIU 14b that are located above ground. Two alternative types of transmitter/receivers 16a and 16b are also shown. The first transmitter/receiver 16a is mounted in a vehicle while the other transmitter/receiver is a handheld unit 16b. An additional type of transmitter/receiver may be permanently mounted at a location central to multiple meters and MIUs. Each of these transmitter/receivers allows utility personnel to receive usage data without manually reading each individual meter. Instead, when each transmitter/receiver 16a and 16b is within range of a MIU 14a or 14b, the data from the meter is transmitted to the transmitter/receiver that in turn transmits it to the computer system of the utility 18. The computer system 18 then calculates the usage of each customer based on the data. Appropriate billing for each customer is then generated by the utility.

The electronic water meters of the system are self-powered by an internal "Wiegand Wire". The Wiegand Wire is a device that generates electrical signals when it is exposed to a magnetic field with changing flux polarity. The wire may also be used to induce voltage across a coil located near the wire. The polarity of the magnetic field is changed by relying on the kinetic energy of the fluid moving through the meter. In some embodiments, the fluid turns an internal water wheel that in turn rotates an attached shaft as it moves through the meter. Multiple magnets are arranged on a circular disc that is attached to the rotating shaft. As the circular disc rotates along with the shaft, the movement of the magnets induces alternating fields of magnetic flux within the Wiegand Wire that is located in close proximity to the disc. The signals generated by the wire due to the changes in the magnetic flux are used to power the electronic circuits that monitor the meter. The rate, volume, and direction of fluid flow through the meter may also be determined by analyzing the number and rate of signals generated by the wire.

Figure 2:
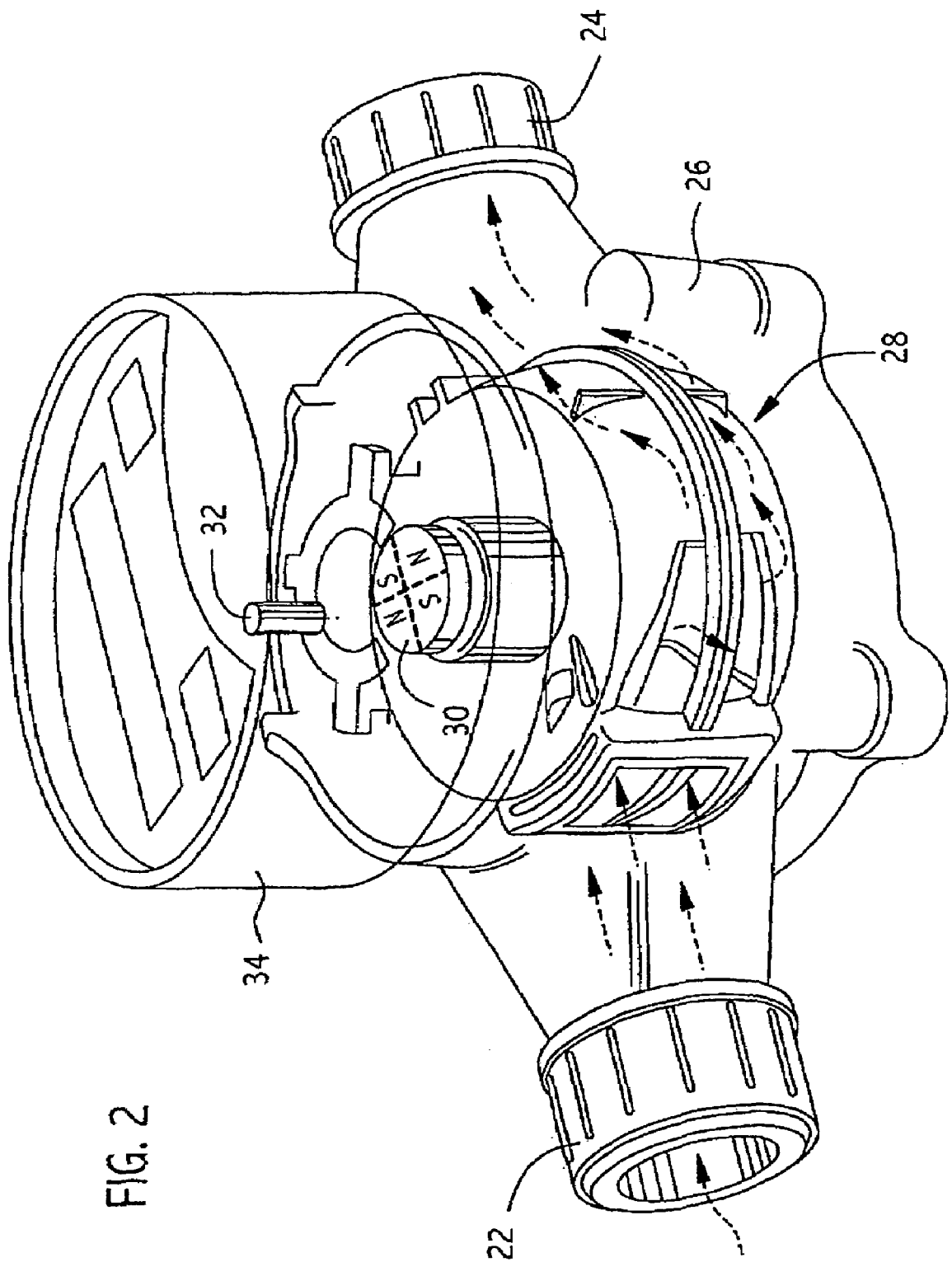
FIG. 2 shows a cut-away diagram of a self-powered water meter in accordance with one embodiment of the present invention.

FIG. 2 shows a cut-away diagram of a self-powered electronic water meter 20 in accordance with one embodiment of the present invention. In this embodiment, the electronic water meter 20 is connected to a water supply line at the meter's inflow connector 22. Water flows from the supply line through the connector 22 into the meter body 26 and out through the outflow connector 24 to the customer. As the water flows through the meter body 26, it forces an internal flow wheel 28 to rotate. The rotating flow wheel 28 in turn rotates a circular magnetic disc 30 that is connected to the flow wheel 28 by a shaft (not shown). The disc 30 in this embodiment is shown with four separate magnetic zones (labeled "N" and "S" for the polar orientation of each zone) that make up a four-pole magnet. In other embodiments, different configurations of magnets could be used.

As the magnetic disc 30 rotates, it changes the magnetic flux polarity for the Wiegand Wire sensor 32 that is located adjacent to the disc 30. As described previously, the changes in polarity induce signals that are generated by the sensor 32. These signals represent data concerning the water flow through the meter 20 and also provide power to the electronic circuits of the meter. Specifically, the stream of signals corresponds to the rate and direction of the water flow through the meter. The flow rate of the water through the meter 20 is calibrated to the rate of rotation of the flow wheel 28, the magnetic disc 30, and the signal stream generated by the sensor 32. In FIG. 2, only one Wiegand Wire sensor 32 is shown in use with the meter 20. It should be understood that multiple sensors could be used in a meter for alternative embodiments of the present invention.

Figure 3:
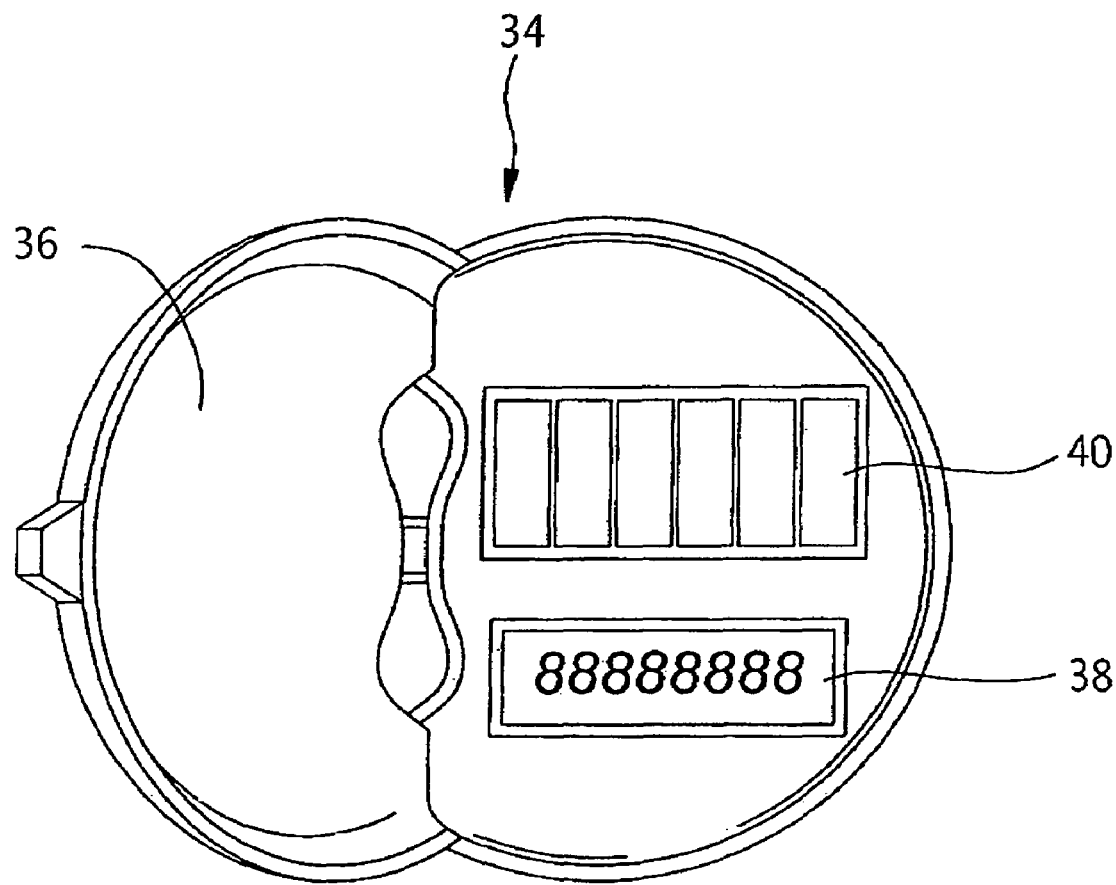
FIG. 3 shows a view of the display of an electronic data recorder in accordance with one embodiment of the present invention.

The data is processed and stored in an electronic data recorder 34 that is attached to the meter 20. The recorder 34 contains an ASIC (Application Specific Integrated Circuit) chip that processes the data. In some embodiments, non-volatile memory is located within the ASIC. This memory serves to store the data. FIG. 3 shows a view of the display of the top of the electronic data recorder 34. The recorder 34 has a cover 36 (shown in the open position) that protects the display 38 from dirt, debris, etc. The display 38 itself is an LCD (Liquid Crystal Display) that shows data. In the present embodiment, nine digits may be shown by the LCD. In alternative embodiments, other types and numbers of display schemes could be used. The display is power by bank of solar cells 40 that are exposed to sunlight when the cover 36 is opened. The display is convenient to use in case a manual reading of the meter is necessary due to failure of an MIU or other system component.

Figure 4:
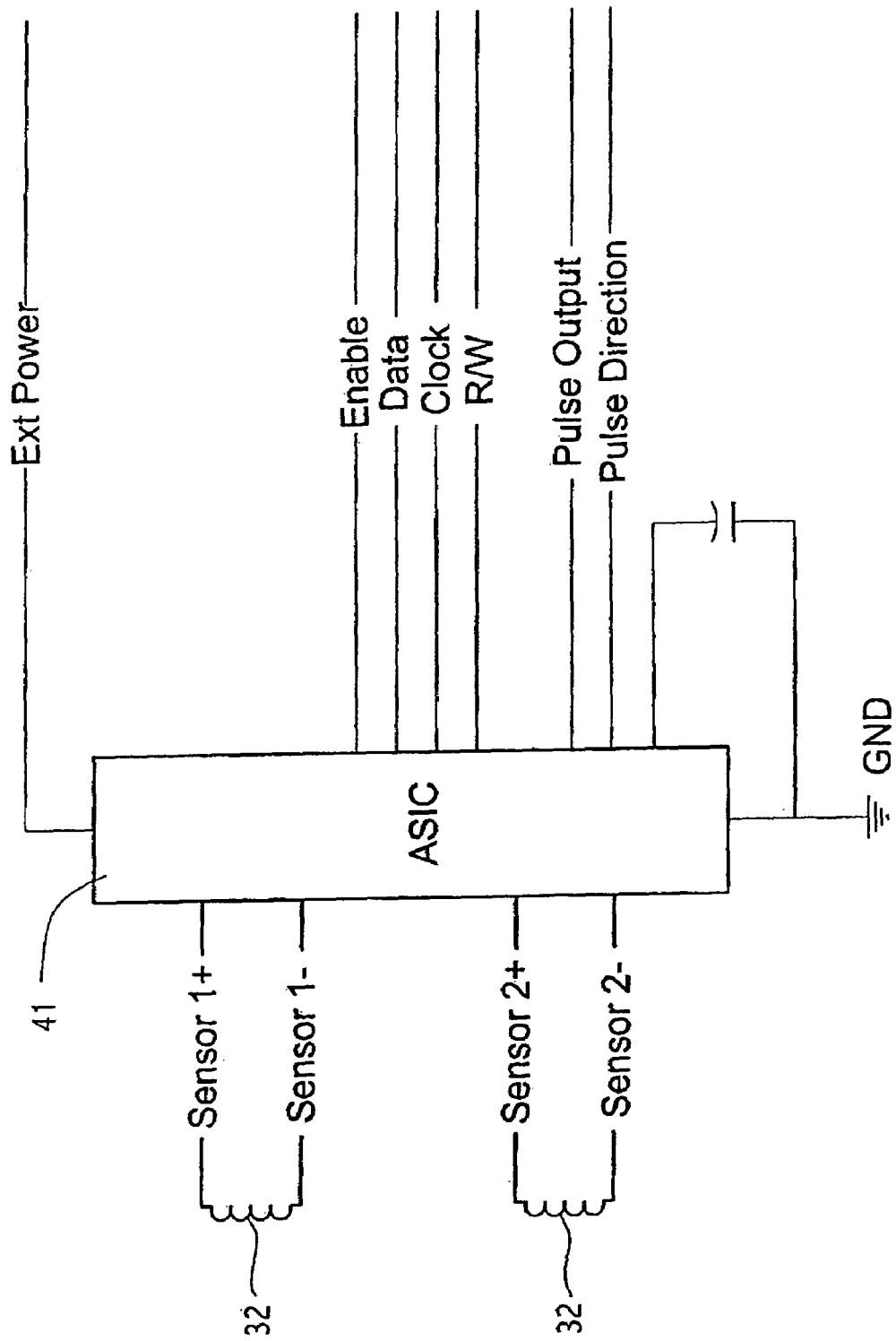
FIG. 4 shows a block diagram of the ASIC circuitry of the electronic data recorder in accordance with one embodiment of the present invention.

FIG. 4 shows a block diagram of the ASIC circuitry of the electronic data recorder. In this embodiment, two Wiegand Wire sensors 32 are used to supply two separate data streams to the ASIC 41. Each sensor 32 produces a separate positive ("+") and a negative ("−") data stream. Other connections to the ASIC include a power supply (EXT POWER) that is external to the ASIC and a ground (GND) connection. In this embodiment, the two Wiegand Wire sensors 32 generate the external power supply. Other connections for the ASIC include: an enable signal (ENABLE); a data signal (DATA); a clock signal (CLOCK); a read/write signal (R/W); an output signal (PULSE OUTPUT); and a direction signal (PULSE DIRECTION). Each of these signals connections passes through a host interface (not shown) to rest of the data recorder.

As mentioned previously, the ASIC chip shown in FIG. 4 has a memory storage capacity that is internal to the chip. In other embodiments, the memory could be external to the ASIC chip and provide the chip with the needed data by an external connection. In this example, the memory is non-volatile which is memory that will not lose its stored data when power is removed. Examples of non-volatile memory include: core memory; ROM; EPROM; flash memory; bubble memory; battery-backed CMOS-RAM; etc. In this example, the non-volatile memory is a ferro-electric random access memory ("FeRAM"). This type of memory is typically used in mobile applications. It is also may be used in applications that are very demanding in terms of minimizing power usage while maximizing performance. In still other embodiments, non-volatile logic or other non-volatile structures could be used.

One technique to minimize power usage involves effective management of the usage of power circuitry. For example, circuitry could be enabled (i.e., activated to use power) for the period of time that it is to be used and then disabled (i.e., inactivated to use little or no power) when it is not needed. This reduces overall power consumption by only enabling the portions of the circuitry that are needed for the current operations. One portion of the memory storage is dedicated to a counter. The counter records incremental increases or decreases in the total number of signals generated by the meter. Typically, each signal or "count" that is generated by the meter will result in an increase of one bit value of an up counter. Likewise, a negative signal may result in the increase of one bit value of the down counter.

Figure 5A:
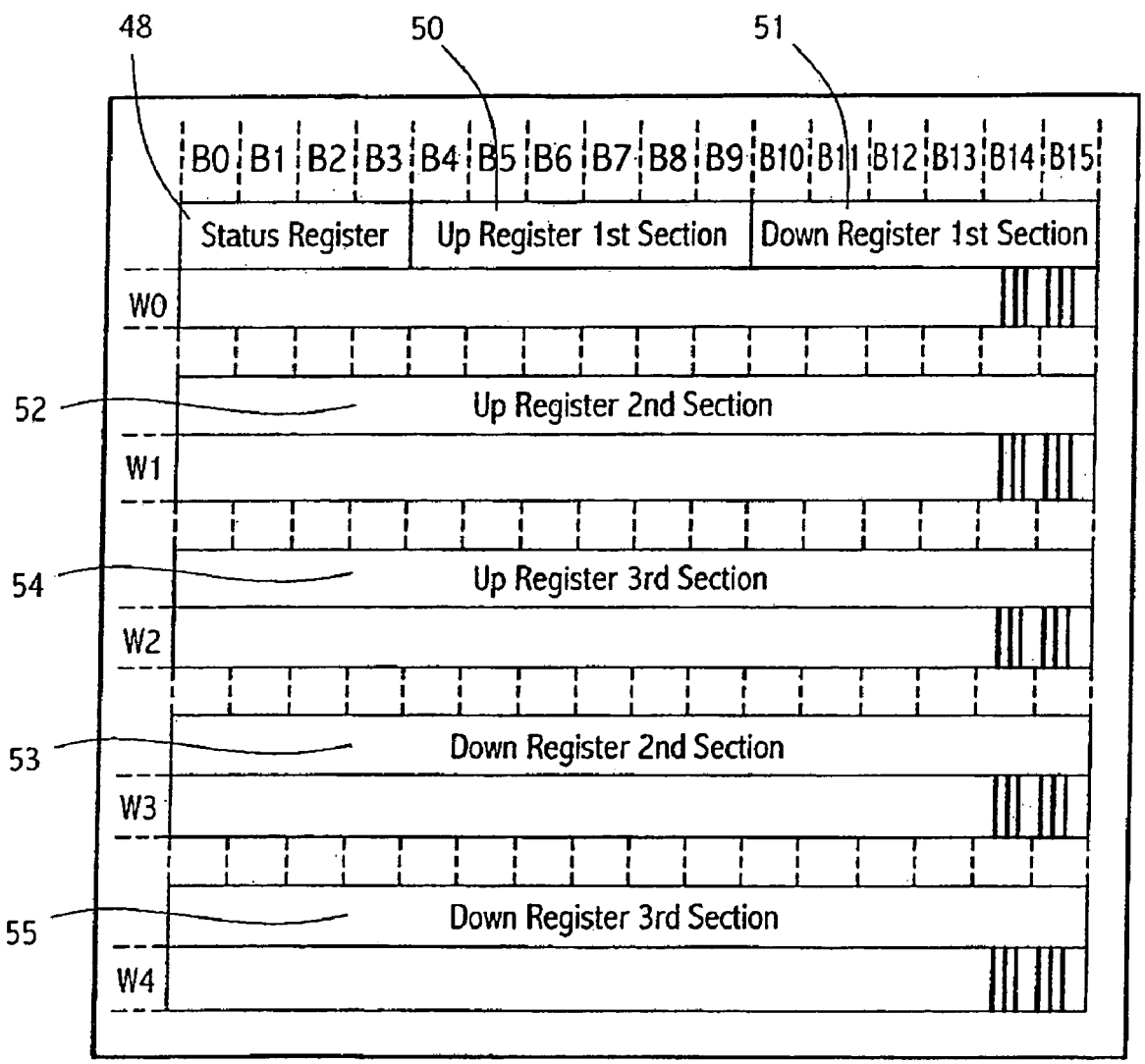
FIG. 5a shows a block diagram of the separate sections of counter storage in accordance with one embodiment of the present invention.

In the present embodiments, the counter has multiple stages to allow the totalization of a large number of bits. The stages are configured in a hierarchical order so that the upper stages contain the bits of greater value while the lower sections hold the bits of lowest value. FIG. 5a shows block diagrams of: three separate sections of memory storage for the up counter 50, 52, and 54; three separate sections of memory storage for the down counter 51, 53, and 55; and a status register 48.

Figure 5B:
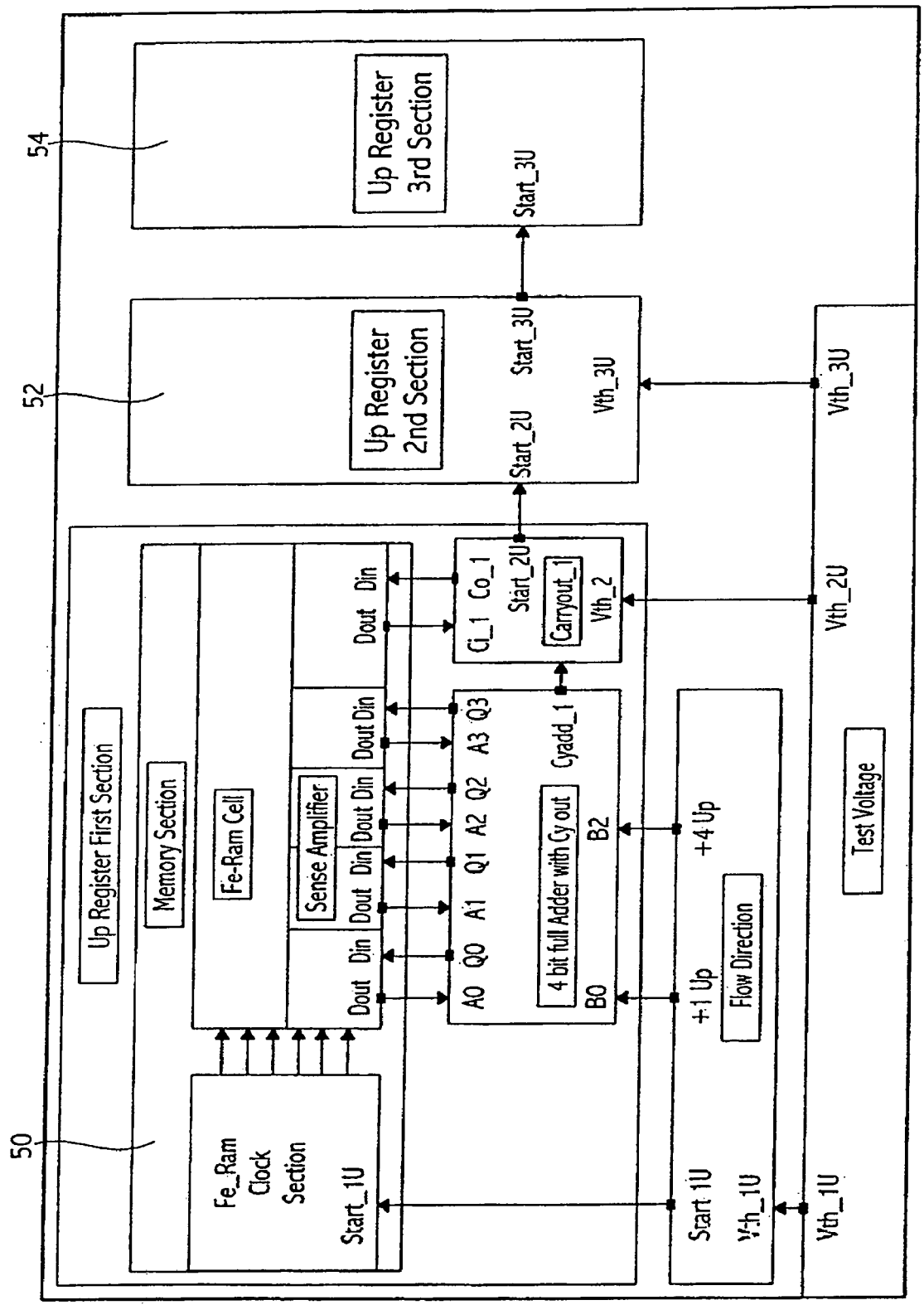
FIGS. 5b-5d show block diagrams of three separate sections of an up counter storage in accordance with one embodiment of the present invention.
Figure 5C:
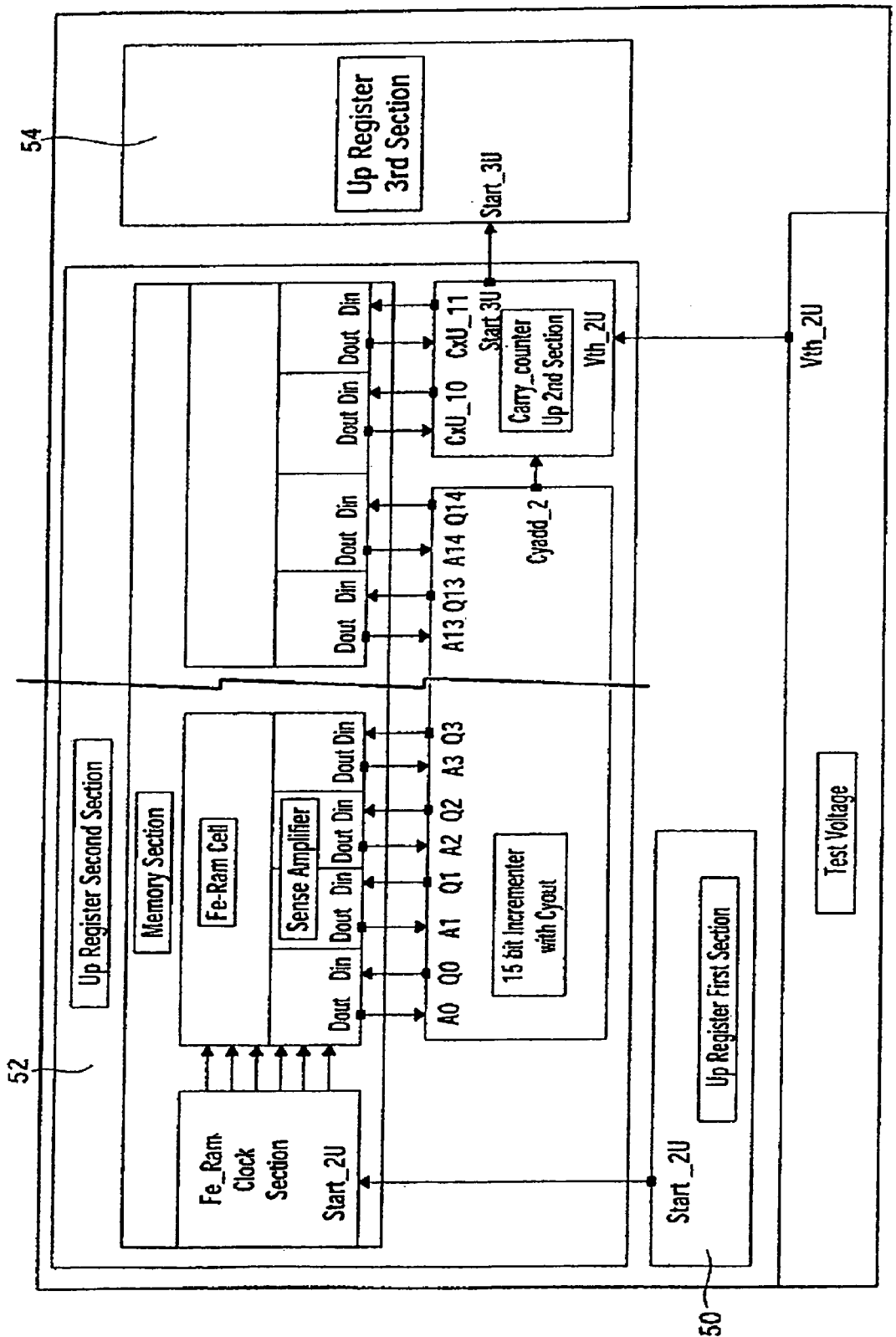
Figure 5D:
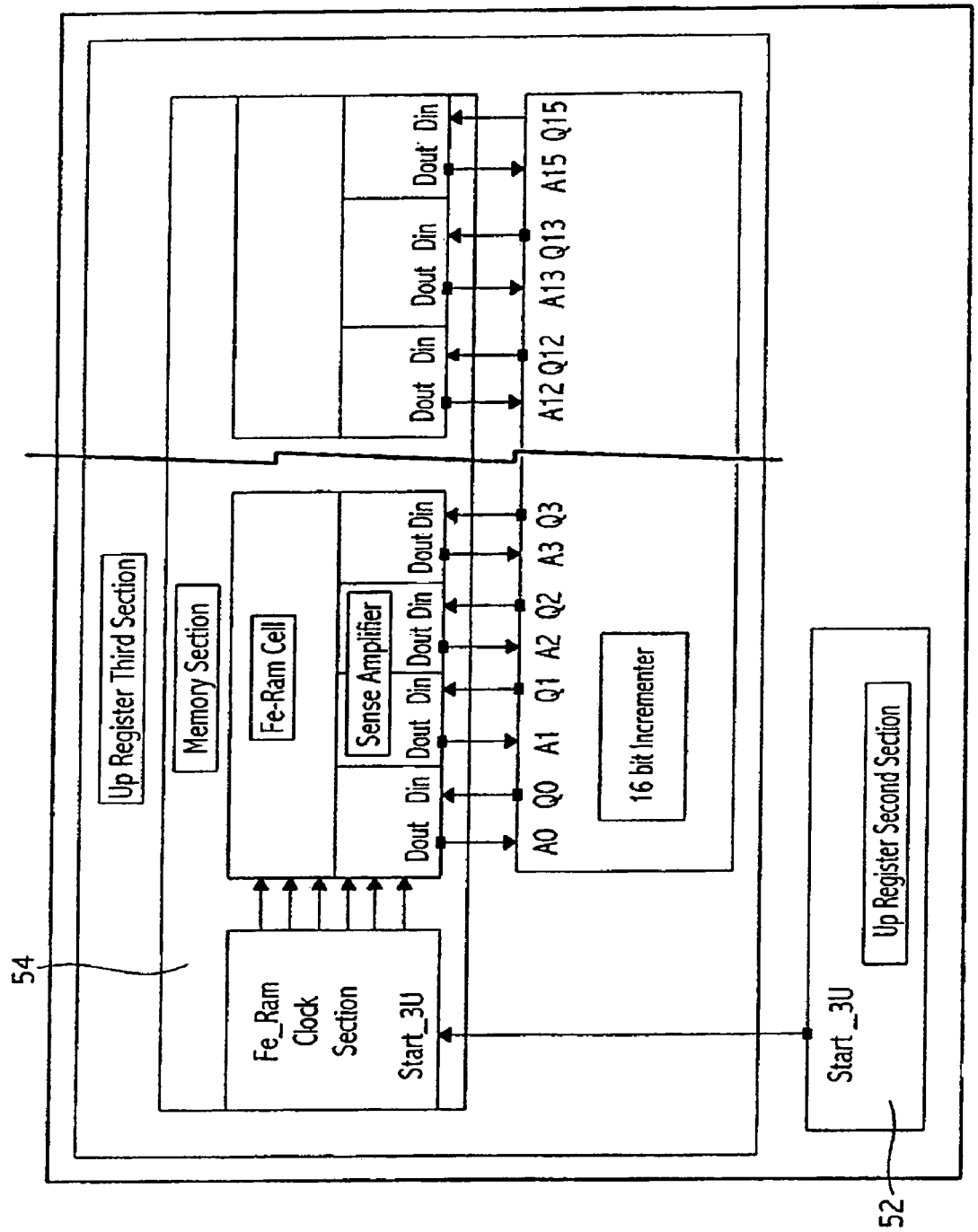
Figure 6:
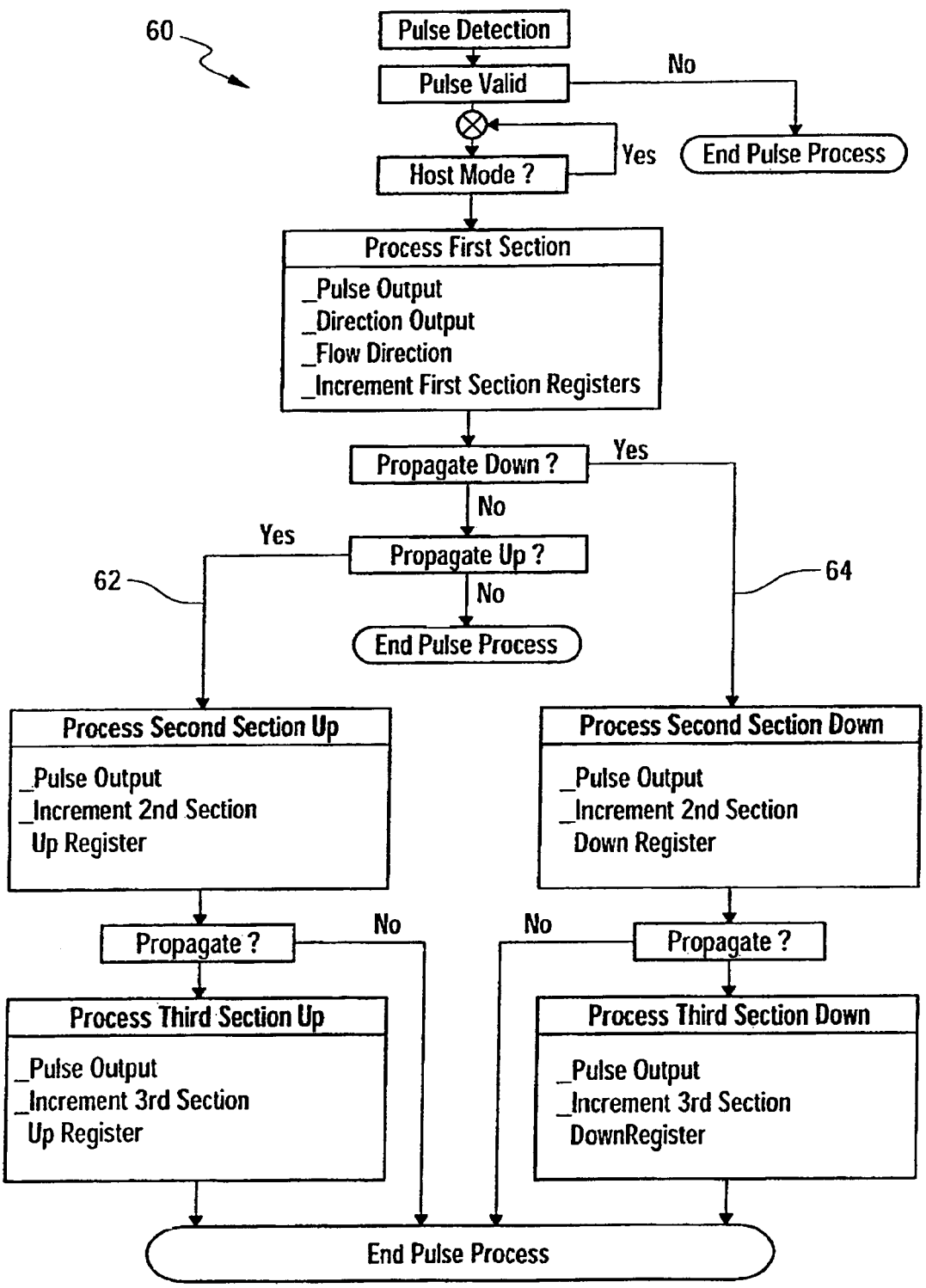
FIG. 6 shows a flow chart for propagation of bits from one section of the counter to another in accordance with one embodiment of the present invention.

FIGS. 5b-5d show alternative block diagrams of three separate sections 50, 52, and 54 of the up counter storage. The first section 50 of the counter holds the lowest value of bits. It propagates a bit value to a second section 52 that has a greater value. The second section 52 in turn propagates bit values to a third section 54 that has a still greater value. Propagation to a higher stage typically occurs once a lower stage reaches its maximum value. At that point, a bit is propagated to the next higher stage and the lower stage's value is reset to zero to begin its count all over again. Consequently, only the lowest stage of the counter is absolutely needed during the incrementation of each count. Accordingly, only a portion counter is needed to be enabled and consume power during most counting operations. FIG. 6 shows a flow chart 60 for propagation of bits from one section of the counter to another. In this example, the counter is divided into an up counter 62 and a down counter 64. The down counter functions in a similar manner as described for the up counter as shown in FIGS. 5b-5d. Each counter 62 and 64 has three separate sections as shown in FIGS. 5b-5d.

In some embodiments, when the counter needs to propagate a bit between its different stages, the bit could be stored within the lower stage until such time as a signal with sufficient energy to successfully propagate it occurs. This prevents signals with low energy levels from propagating bits and possibly losing data. This technique of storage area for the bits awaiting propagation is called "propagation filtering". The data in the FeRAM cells shown in FIGS. 5a-5c may be stored and transmitted as a 16-bit word. The 16-bit word is broken down into three sections that contains the data bits for the up register in the first section, the data bits for the down register in the second section, and the data bits for the status register in the third section. This allows a better opportunity for the counter to process the data with a weak data signal because flow direction and updating the appropriate register can be done with one access of the memory.

Before a bit may access a section of a memory register, a test comparison is made to ensure that adequate energy is available to propagate the bits through the sections of the counter. The amount of energy available is determined by comparing the supply voltage of the system ("Vdd1") to predetermined threshold voltage values ("Vth1" and "Vth2"). Vdd1 will typically vary between a maximum operating voltage value ("VopH") and a minimum operating voltage value ("VopL"). FIGS. 9a-9c show charts that give the values of the various parameters used by the system, including: the external capacitor load on Vdd1; the total charge; the ranges for VopH and VopL; the values of Vth1 and Vth2; and the range between VopH and the threshold voltages. The values are expressed with a minimum value, a maximum value, and a typical value.

Figure 7:
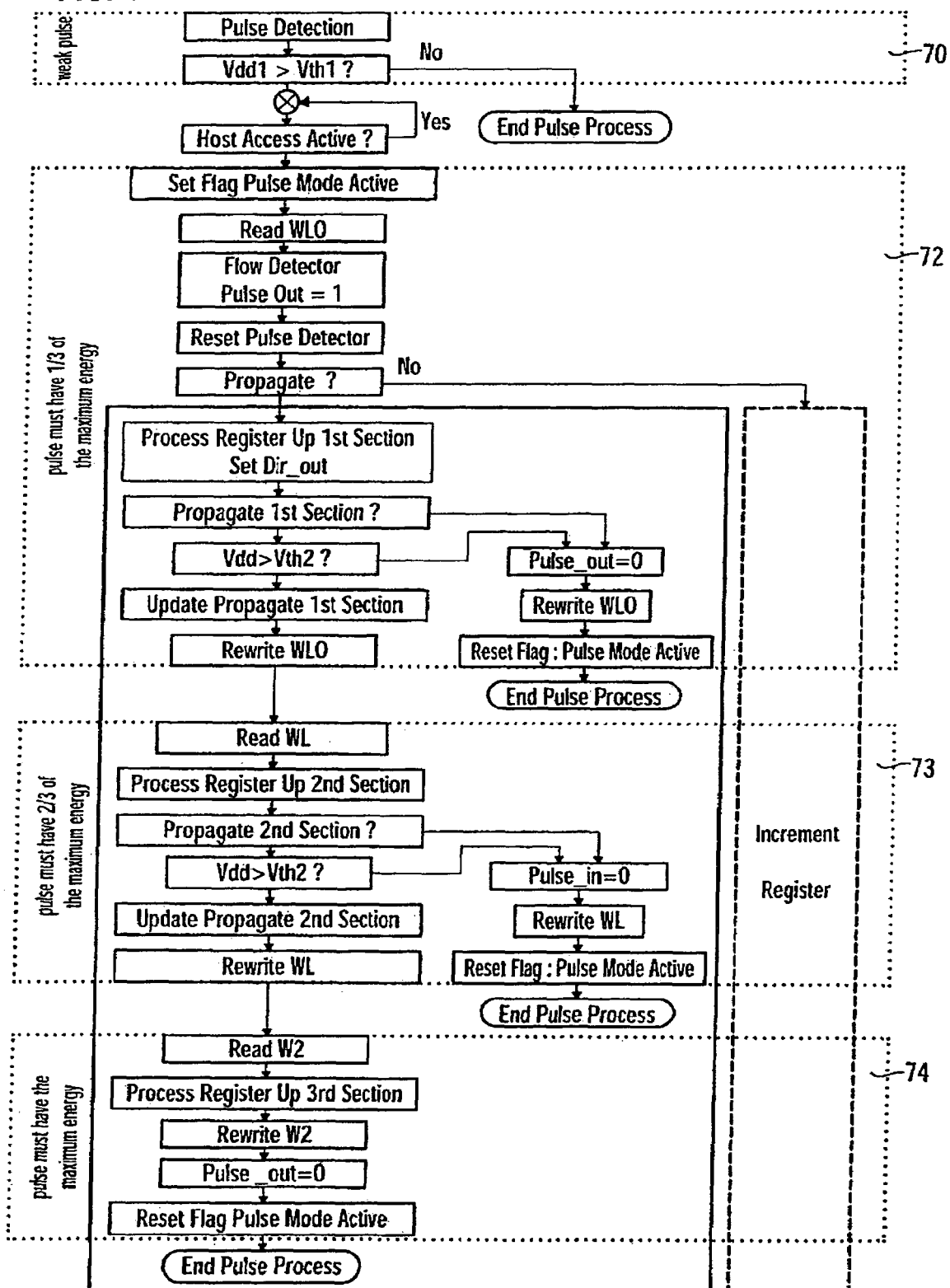
FIG. 7 shows a flow chart for propagation filtration from one section of the counter to another in accordance with one embodiment of the present invention.

FIG. 7 shows a flow chart for the steps of data bit propagation for an up register. In each step, Vdd1 is compared with one of the threshold voltage values. Also as the bit propagates through the counter, more power is required to access each section. For example, the signal must have ⅓ of the maximum energy to access the first section 72. Further, the signal must have ⅔ of the maximum energy to access the second section 74 and full power to access the third section 76. It should be understood that similar configurations and parameters exist in the down register of the counter.

As shown in FIG. 7, if Vdd1 does not meet the threshold value, the data is held in its present section and not allowed to propagate further into the counter. For example, Vth1 is the threshold value to detect a weak signal 70. When Vth1 is tested, only the Read modified Write register ("Read WL0") is used so Vth1 is set for ⅓ of the total energy. Vth2 is the threshold value for propagation of a data bit. As such, it accesses the two Read Write registers ("Read W1" and "Read W2") and is set for ½ of the total energy. In the worst case scenario, the upper operating range (VopH-Vth2) must have at least enough energy to: (1) Read WL0; (2) Re-write WL0; and (3) Read the register of the second section. In the worst case scenario, the lower operating range (Vth2-VopL) must have at least enough to: (1) Re-write the second section; (2) Read the register of the third section; and (3) Re-write the third section. With the parameter values shown in FIG. 9a, the maximum voltage drop in an operation may be calculated as Qt/Cl=3.27 nC/3.685 nF=0.888V. From this, the threshold values may be calculated as:

(1) Vth1>VopL+(Max Drop/3); and (2) Vth2>VopL+(Max Drop/2). This yields values of Vth1=3.796V and Vth2=3.944V.

Figure 8:
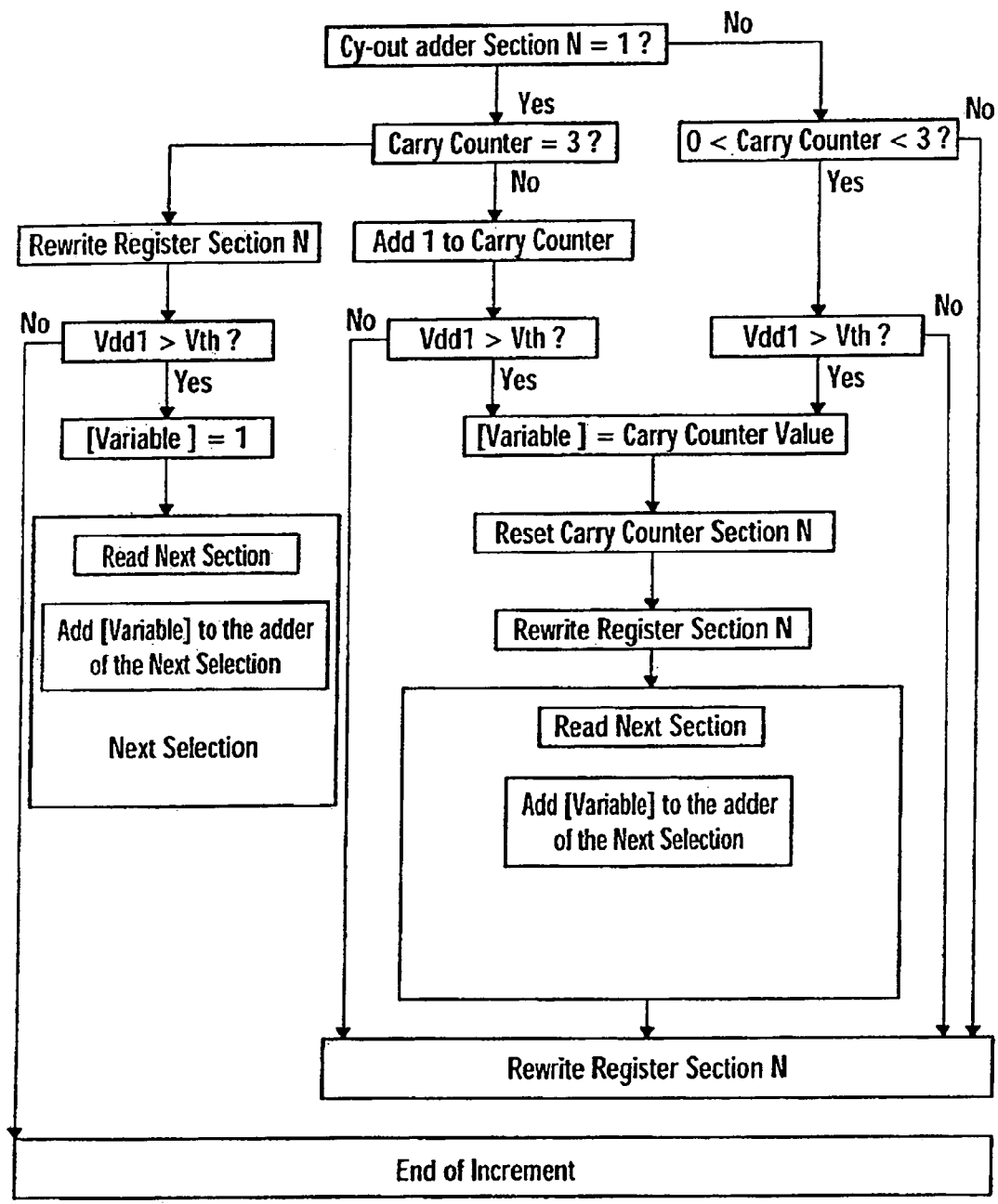
FIG. 8 shows flow chart for the operation of a propagation carry counter in accordance with one embodiment of the present invention.

Each register, the up and down, has three sections in this example, when one of the sections is at its maximum value, a carry bit must be propagated to the adjacent section. In the worst case scenario, a bit would have to be propagated from each section that would consequently require three simultaneous section accesses. In order to minimize power consumption, a 2-bit propagation "carry counters" is used between the first and second section. Another 2-bit propagation carry counters is used between the second and third section. FIG. 8 shows a flow chart for the operations of a propagation carry counter. The carry counter is incremented once when the lower section attempts to propagate a bit and Vdd1 is below the threshold voltage. When another propagation from the lower section occurs and Vdd1 is above the threshold voltage, the value of the carry counter is propagated to the higher section and the carry counter is reset to zero. However, since the carry counter is only a two-bit binary counter, it has a maximum content value of three. If the value of the carry counter is two and it receives another propagation, this indicates that the carry counter has received too many weak signal propagations in a row. In this case, the value of three is an error flag to alert the system of the problem. Any further propagations will be passed to the higher section only if Vdd1 meets the threshold voltage and the error status is reset.

While the invention has been described with respect to a limited number of embodiments, those skilled in the art, having benefit of this disclosure, will appreciate that other embodiments can be devised which do not depart from the scope of the invention as disclosed here. Accordingly, the scope of the invention should be limited only by the attached claims.

What is claimed is:

1. A method for operating an electronic counter, comprising:
- updating the electronic counter for a water meter where the electronic counter is divided into a plurality of segments that are configured according to numerical value;
- propagating data between the segments when the supply energy of the electronic counter meets or exceeds a pre-determined value; and
- storing the propagated data for later transmission to an end user in a two-bit binary propagation carry counter when the supply energy of the electronic counter does not meet the pre-determined value.

2. The method of claim 1, where the two-bit binary propagation carry counter stores the propagated data until the supply energy of the electronic counter meets or exceeds the pre-determined value.

3. The method of claim 1, where the electronic counter is divided into three segments.

4. The method of claim 1, where the electronic counter is divided into an up counter with three segments and a down counter with three segments.

5. The method of claim 1, where the plurality of segments comprise memory cells.

6. The method of claim 5, where the memory cells are non-volatile memory cells.

7. The method of claim 6, where non-volatile memory cells comprise FeRAM cells.

8. The method of claim 1, where the water meter is a self-powered water meter.

9. The method of claim 8, where the self-powered water meter is powered by a Wiegand Wire.

10. The method of claim 1, where the propagation carry counter generates an error notification when the propagation carry counter's contents are full and the propagation carry counter receives additional propagated data.

* * * * *